US011221693B2

(12) United States Patent
Zhao et al.

(10) Patent No.: US 11,221,693 B2
(45) Date of Patent: Jan. 11, 2022

(54) DISPLAY PANEL AND DISPLAY DEVICE

(71) Applicant: Wuhan China Star Optoelectronics Semiconductor Display Technology Co., Ltd., Wuhan (CN)

(72) Inventors: Yong Zhao, Wuhan (CN); Zuomin Liao, Wuhan (CN); Tao Chen, Wuhan (CN)

(73) Assignee: Wuhan China Star Optoelectronics Semiconduetor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/753,779

(22) PCT Filed: Nov. 6, 2019

(86) PCT No.: PCT/CN2019/116013
§ 371 (c)(1),
(2) Date: Apr. 5, 2020

(87) PCT Pub. No.: WO2021/027104
PCT Pub. Date: Feb. 18, 2021

(65) Prior Publication Data
US 2021/0041969 A1 Feb. 11, 2021

(30) Foreign Application Priority Data

Aug. 9, 2019 (CN) .......................... 201910735958.8

(51) Int. Cl.
*G06F 3/047* (2006.01)
*G06F 3/041* (2006.01)
*H01L 27/32* (2006.01)
*H04N 5/225* (2006.01)

(52) U.S. Cl.
CPC ............ *G06F 3/041* (2013.01); *H01L 27/323* (2013.01); *H04N 5/2257* (2013.01)

(58) Field of Classification Search
None
See application file for complete search history.

(56) References Cited

U.S. PATENT DOCUMENTS

2017/0084668 A1* 3/2017 Wang .................... G06F 3/0421
2019/0317629 A1* 10/2019 Jung ..................... G06F 1/1643

* cited by examiner

*Primary Examiner* — Carl Adams

(57) ABSTRACT

The present invention provides a display panel and a display device. The display panel includes a touch layer, a main display region, and a functional add-on region. A plurality of first pixels are arranged in the functional add-on region, and the touch layer is provided with an opening corresponding to the functional add-on region. A transmittance of the touch layer corresponding to the functional add-on region is greater than a transmittance of the touch layer corresponding to the main display region.

17 Claims, 13 Drawing Sheets

DISPLAY PANEL AND DISPLAY DEVICE

RELATED APPLICATIONS

This application is a National Phase of PCT Patent Application No. PCT/CN2019/116013 having International filing date of Nov. 6, 2019, which claims the benefit of priority of Chinese Patent Application No. 201910735958.8 filed on Aug. 9, 2019. The contents of the above applications are all incorporated by reference as if fully set forth herein in their entirety.

FIELD AND BACKGROUND OF THE INVENTION

The present invention relates to the field of display technologies, and in particular, to a display panel and a display device.

In the design of OLED display panels, it has always been a problem to realize cameras under the OLED display panel and transparent display. A main problem to realize transparent display and under-screen cameras is how to improve a transmittance of a panel. At present, since touch layers have a greater influence on a transmission of light, they will affect photographing and imaging of photosensitive elements such as an under-screen camera, which makes it difficult to realize a corresponding area of the camera having a touch function and a light transmission function at the same time.

SUMMARY OF THE INVENTION

Since touch layers have a greater influence on a transmission of light, they will affect photographing and imaging of photosensitive elements such as an under-screen camera, which makes it difficult to realize a corresponding area of the camera having a touch function and a light transmission function at the same time.

A display panel, comprises a touch layer, a main display region, and a functional add-on region;

wherein a plurality of first pixels are arranged in the functional add-on region, and the touch layer is provided with an opening corresponding to the functional add-on region;

wherein a transmittance of the touch layer corresponding to the functional add-on region is greater than a transmittance of the touch layer corresponding to the main display region; and wherein there is no touch line arranged in the opening of the touch layer, or there is a touch line formed by a transparent conductor material disposed in the opening of the touch layer.

Further, no touch line is arranged in the opening of the touch layer when an area of the opening of the touch layer is less than or equal to 4 square millimeters ($mm^2$).

Further, no touch line is arranged in the opening of the touch layer when a diameter of the opening of the touch layer is less than or equal to 2 mm.

Further, a shape of the opening of the touch layer is circular, large semicircular or small semicircular.

Further, the touch line is electrically connected to the touch layer.

Further, a peripheral side of the functional add-on region is provided with at least one first driving circuit and at least one signal line, a first anode for driving one of the plurality of first pixels is disposed in the functional add-on region, and the first driving circuit is electrically connected to the first anode through a transparent wire.

Further, a plurality of pixel driving circuit islands are disposed on the peripheral side of the functional add-on region, a first group of pixel driving circuit islands among the pixel driving circuit islands comprises a plurality of the first driving circuits, the signal lines comprise a plurality of first signal lines and a plurality of second signal lines, and the plurality of first signal lines and the plurality of the second signal lines are electrically connected to the plurality of first driving circuits.

Further, each of the first signal lines comprises a first bypass section, each of the second signal lines comprises a second bypass section, and the first bypass section and the second bypass section are disposed at different layers; and wherein the first bypass sections of the plurality of first signal lines are disposed at an edge of the functional add-on region, and the second bypass sections of the plurality of second signal lines are disposed at the edge of the functional add-on region.

A display panel comprises a touch layer, a main display region, and a functional add-on region;

wherein a plurality of first pixels are arranged in the functional add-on region, and the touch layer is provided with an opening corresponding to the functional add-on region;

wherein a transmittance of the touch layer corresponding to the functional add-on region is greater than a transmittance of the touch layer corresponding to the main display region Further, no touch line is arranged in the opening of the touch layer.

Further, no touch line is arranged in the opening of the touch layer when an area of the opening of the touch layer is less than or equal to 4 square millimeters ($mm^2$).

Further, no touch line is arranged in the opening of the touch layer when a diameter of the opening of the touch layer is less than or equal to 2 mm.

Further, a shape of the opening of the touch layer is circular, large semicircular or small semicircular.

Further, a touch line formed by a transparent conductor material is disposed in the opening of the touch layer.

Further, the touch line is electrically connected to the touch layer.

Further, a peripheral side of the functional add-on region is provided with at least one first driving circuit and at least one signal line, a first anode for driving one of the plurality of first pixels is disposed in the functional add-on region, and the first driving circuit is electrically connected to the first anode through a transparent wire.

Further, a plurality of pixel driving circuit islands are disposed on the peripheral side of the functional add-on region, a first group of pixel driving circuit islands among the pixel driving circuit islands comprises a plurality of the first driving circuits, the signal lines comprise a plurality of first signal lines and a plurality of second signal lines, and the plurality of first signal lines and the plurality of the second signal lines are electrically connected to the plurality of first driving circuits.

Further, each of the first signal lines comprises a first bypass section, each of the second signal lines comprises a second bypass section, and the first bypass section and the second bypass section are disposed at different layers; and wherein the first bypass sections of the plurality of first signal lines are disposed at an edge of the functional add-on region, and the second bypass sections of the plurality of second signal lines are disposed at the edge of the functional add-on region.

A display device, comprises a display panel and a functional device, wherein the display panel comprises a touch layer, a main display region, and a functional add-on region, and the functional device is disposed corresponding to the functional add-on region of the display panel;

wherein a plurality of first pixels are arranged in the functional add-on region, and the touch layer is provided with an opening corresponding to the functional add-on region; and wherein a transmittance of the touch layer corresponding to the functional add-on region is greater than a transmittance of the touch layer corresponding to the main display region.

By removing corresponding portions of a touch layer and an additional functional region, the touch layer is prevented from affecting photographing and imaging of photosensitive elements such as a camera, and determining whether to arrange touch lines at the functional add-on region according to an area of the functional add-on region. When the area of the functional add-on region is large, the touch lines are formed by using a highly transparent conductor material, so that the functional add-on region can be used for displaying images and mounting the photosensitive elements such as the camera, and has a touch function to improve user experience.

BRIEF DESCRIPTION OF THE SEVERAL VIEWS OF THE DRAWINGS

In order to more clearly illustrate the embodiments or the technical solutions in the prior art, a brief introduction of the drawings used in the embodiments or the prior art description will be briefly described below. Obviously, the drawings in the following description are only some of the embodiments of the invention, and those skilled in the art can obtain other drawings according to the drawings without any creative work.

REFERENCE NUMERALS

10: display panel; 11: main display region; 111: second pixel; 1111: second anode; 1112: second driving circuit; 12: functional add-on region; 121: first pixel; 1211: first driving circuit; 1212: first anode; 21: first sector region; 22: second sector region; 30: pixel driving circuit island; 41: first signal line; 411: first straight line section; 412: first transition section; 413: first bypass section; 42: second signal line; 421: second straight line section; 422: second transition section; 423: second bypass section; 50: substrate; 61: first insulating layer; 62: second insulating layer; 63: third insulating layer; 64: fourth insulating layer; 71: first overlapping line; 72: second overlapping line; 73: third overlapping line; 80: pixel definition layer; 81: pixel opening; 90: touch layer; 91: opening; 101: touch line; 103: functional device; 104: connecting line.

DESCRIPTION OF SPECIFIC EMBODIMENTS OF THE INVENTION

The following description of the various embodiments is provided with reference to the accompanying drawings. Directional terms, such as upper, lower, front, back, left, right, inner, outer, and lateral side, mentioned in the present invention are only for reference. Therefore, the directional terms are used for describing and understanding rather than limiting the present invention. In the figures, units having similar structures are used for the same reference numbers.

The present invention is directed at a technical problem of a current OLED display panel, which is: since a touch layer has a greater influence on a transmission of light, thereby affecting photographing and imaging of photosensitive elements such as an under-screen camera, this makes it difficult to realize a corresponding area of the camera having a touch function and a light transmission function at the same time.

Figure 1:
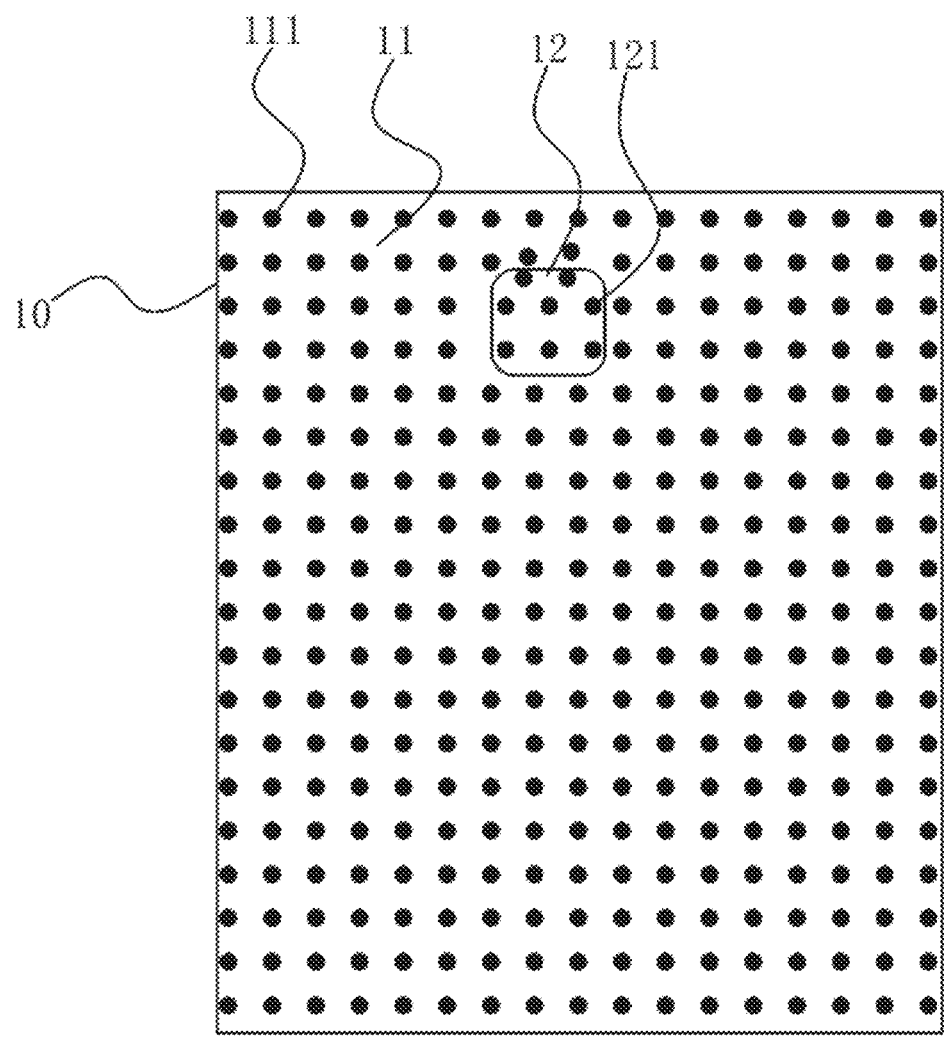
FIG. 1 is a schematic view of a display panel according to an embodiment of the present invention.

A display panel, as shown in FIG. 1, the display panel 10 comprises a main display region 11 and a functional add-on region 12. At least one portion of the functional add-on region 12 is surrounded by the main display region 11.

The display panel 10 can be a full screen display panel 10. A plurality of first pixels 121 are arranged in the functional add-on region 12, a plurality of second pixels 111 are arranged in the main display region 11. The main display region 11 can display an image, and the functional add-on region 12 can be disposed at any position of the display panel 10.

The functional add-on region 12 can be used for displaying images, so that the display panel 10 can exhibit an effect of a full-screen display, and the functional add-on region 12 can also be used for mounting photosensitive elements such as a camera, an optical touch component, and a fingerprint recognition sensor, thereby improving user experience.

It should be noted that a pixel density in the functional add-on region 12 may be the same as or different from a pixel density in the main display region 11. For example, the pixel density of the functional add-on region 12 is less than the pixel density in the main display region 11 to increase a transmittance of the functional add-on region 12.

It should be noted that display brightness at the functional add-on region 12 may be the same as or different from display brightness at the main display region 11. The display brightness at the functional add-on region 12 and the display brightness at the main display region 11 can be adjusted by adjusting a drive current.

In an embodiment, each of the first pixels 121 comprises a first red sub-pixel, a first blue sub-pixel, and a first green sub-pixel; and each of the second pixels 111 comprises a second red sub-pixel, a second blue sub-pixel, and a second green sub-pixel.

Figure 2:
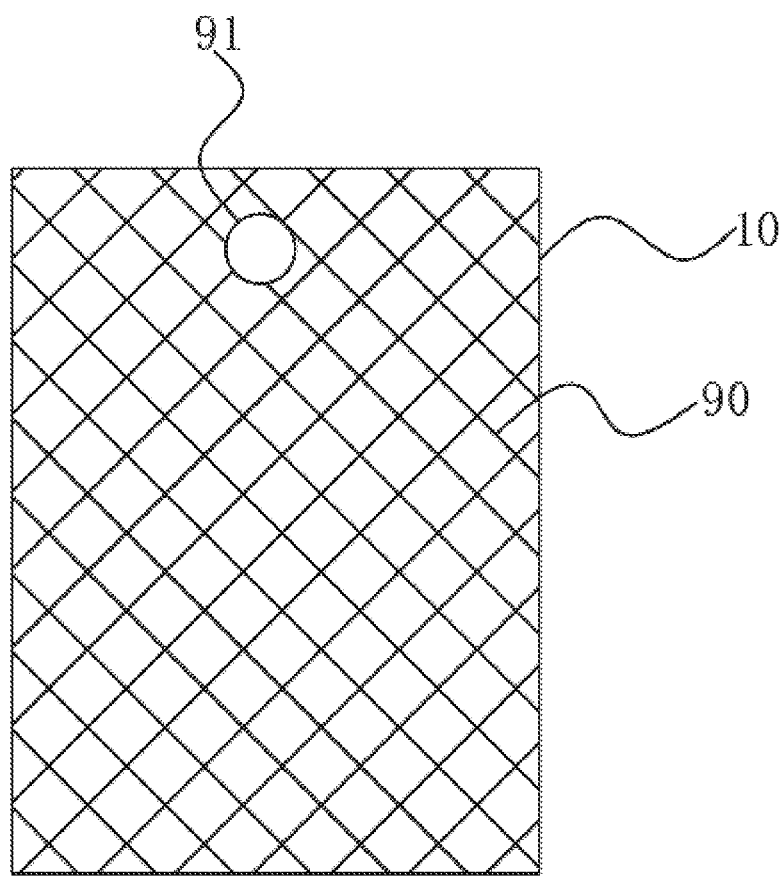
FIG. 2 is a schematic view of a touch layer according to an embodiment of the present invention.

Specifically, as shown in FIG. 2, the display panel 10 has a touch layer 90, and the touch layer 90 is provided with an opening 91 corresponding to the functional add-on region 12. A transmittance of the touch layer 90 corresponding to the functional add-on region 12 is greater than a transmittance of the touch layer 90 corresponding to the main display region 11.

By providing the opening 91 at a position corresponding to the functional add-on region 12 on the touch layer 90, a portion corresponding to the touch layer 90 and the functional add-on region 12 is removed, thereby preventing the touch layer 90 from affecting photographing and imaging of photosensitive elements such as a camera. The functional add-on region 12 can be used to display images, so that the display panel 10 can exhibit a full-screen display effect, and the functional add-on region 12 can also be used for mounting the photosensitive elements such as the camera to improve the user experience.

It should be noted that a design of a position of the touch layer 90 in the display panel 10 is not limited, and may be an external type (i.e. the touch layer 90 is disposed on a cover glass of the display panel 10), may be an on-cell type (i.e. the touch layer 90 is disposed on a package layer), and may also be an in-cell type (i.e., the touch layer 90 is disposed between the package layer and a thin film transistor layer).

It should be noted that an area of the opening 91 may be equal to an area of the functional add-on region 12, and the area of the opening 91 may also be less or greater than the area of the functional add-on region 12.

In an embodiment, no touch line 101 is arranged in the opening 91 of the touch layer 90.

It should be noted that, as can be known to those skilled in the art, the size of a general human finger and a common stylus tip is about 4 square millimeters. When the area of the opening 91 is less than the size of the general human finger and the common stylus tip, even if the opening 91 does not have the touch layer, the influence on the user experience is small. Therefore, it is optional to arrange or not to arrange the touch function at the opening 91.

Further, no touch line 101 is arranged in the opening 91 of the touch layer 90 when the area of the opening 91 of the touch layer 90 is less than or equal to 4 square millimeters.

The design of the touch line 101 is not performed at the opening 91, and interference and diffraction of light are reduced, so that the transmittance of the functional add-on region 12 can be improved, the photographing and imaging quality of the photosensitive elements such as the camera can be improved, and can reduce processes and save costs.

Figure 3:
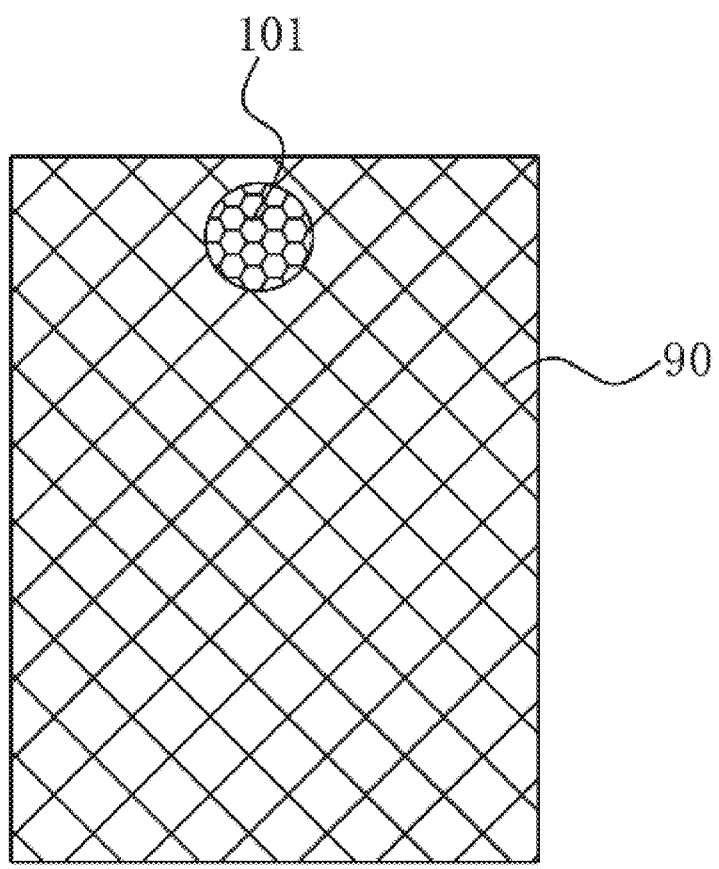
FIG. 3 is a schematic view of the touch layer and a touch line according to another embodiment of the present invention.

In another embodiment, as shown in FIG. 3, a touch line 101 formed by a transparent conductive material is disposed in the opening 91 of the touch layer 90.

It should be noted that, as is known to those skilled in the art, when the area of the opening 91 is greater than the size of the general human finger and the common stylus tip, when the user uses a product for games or the like, if the opening 91 has no touch function, it is easy to reduce the user experience. When a high transparent material is used to form the touch line 101 at the opening 91, the highly transparent material can reduce the interference and diffraction of the touch line 101 to the light, so that the opening 91 also has a touch function, thereby improving the user experience while preventing the touch line 101 from affecting the display function and the light transmission function at the functional add-on region 12.

It should be noted that, in actual implementation, whether the touch line 101 is disposed at the opening 91 is related to the area of the opening 91, and is also related to a display area of the display panel 10. When the display area of the display panel 10 is large, whether the touch line 101 is disposed at the opening 91 can be determined according to a ratio of the opening 91 and the display area of the display panel 10 according to an actual situation.

It should be noted that the transparent conductor material includes but is not limited to indium tin metal oxide, indium zinc metal oxide, fluorine tin metal oxide, or nano silver wire.

In the case where the touch line 101 is disposed at the opening 91, the touch line 101 can be electrically connected to the touch layer 90, and the touch line 101 and touch layer 90 can be controlled at the same time by using a control circuit of the touch layer 90 without adding additional control lines.

It should be noted that, in the case where the touch line 101 is disposed at the opening 91, a second control circuit for controlling the touch line 101 may be disposed on the display panel 10. The second control circuit is electrically connected to the touch line 101 through a transparent wire, so as to more finely control the touch line 101 disposed at the opening 91 to prevent the touch line 101 and the touch layer 90 from interacting with each other.

It should be noted that the touch layer 90 can be an infrared touch layer, a capacitive touch layer, a nano touch layer, or a resistive touch layer. In the case where the touch line 101 is disposed at the functional add-on region 12, the touch line 101 may be formed by the same process as the touch layer 90, or may be formed by using different processes. The touch line 101 can be disposed in the same layer as the touch layer 90 or in different layers from the touch layer 90 to prevent the touch layer 90 and the touch line 101 from interfering with each other.

Figure 4:
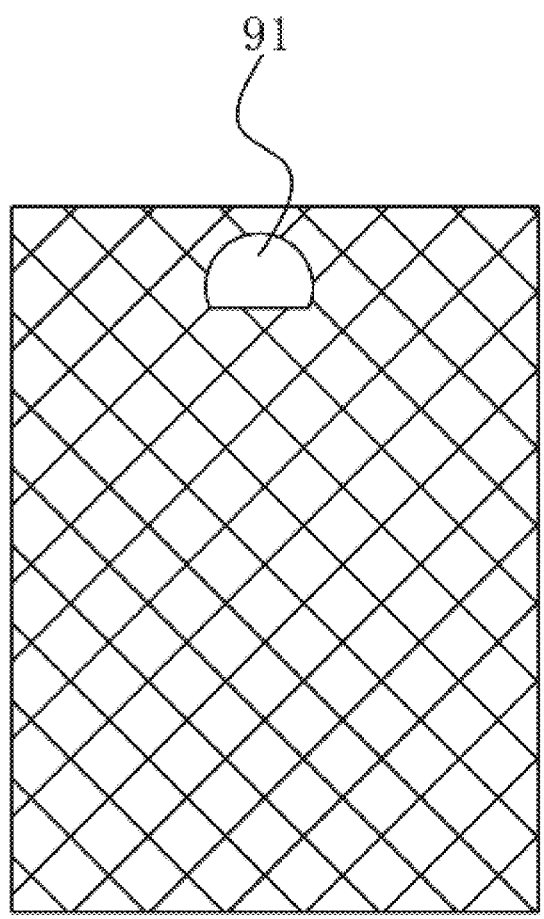
FIG. 4 is a schematic view showing a functional add-on region in a form of a large semicircular shape in the present invention.
Figure 5:
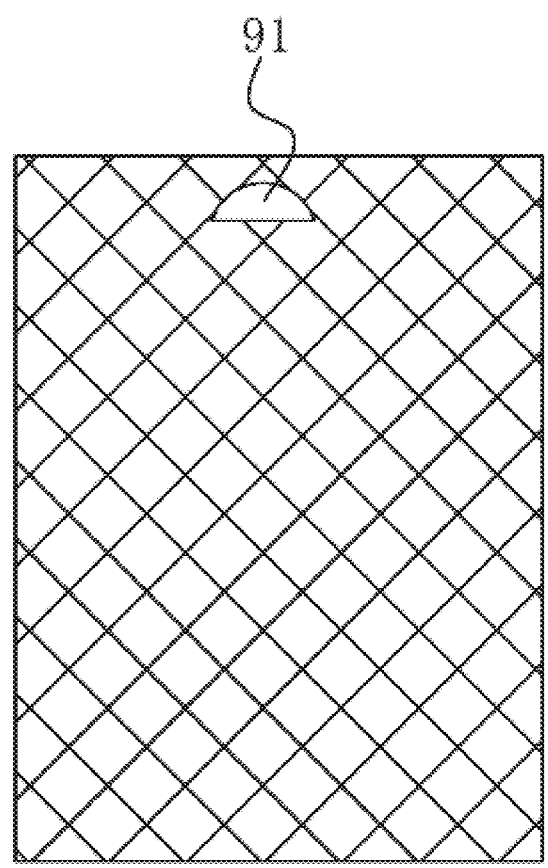
FIG. 5 is a schematic view showing the functional add-on region in the form of a small semicircle in the present invention.

As shown in FIG. 4 and FIG. 5, in an embodiment, the opening 91 of the touch layer 90 has a circular shape, a large semicircular shape (as shown in FIG. 4) or a small semicircular shape (as shown in FIG. 5).

There is no touch line 101 arranged in the opening 91 of the touch layer 90 when a diameter of the opening 91 of the touch layer 90 is less than or equal to 2 mm.

When the diameter of the opening 91 of the touch layer 90 is greater than 2 mm, the opening 91 of the touch layer 90 is provided with the touch line 101 formed of a transparent conductive material.

It should be noted that, in actual implementation, the opening 91 can also be of other shapes, such as an ellipse, a rectangle, a rounded rectangle, a regular polygon, or an irregular polygon, which are not enumerated here.

It should be noted that, in the embodiment, in order to ensure that the transmittance of the functional add-on region 12 can meet a lighting requirement of the photosensitive elements such as the camera, in addition to the above design of the touch layer 90, it is also possible to specifically design a driving circuit and a signal line having a certain shading effect in the functional add-on region 12.

Figure 6:
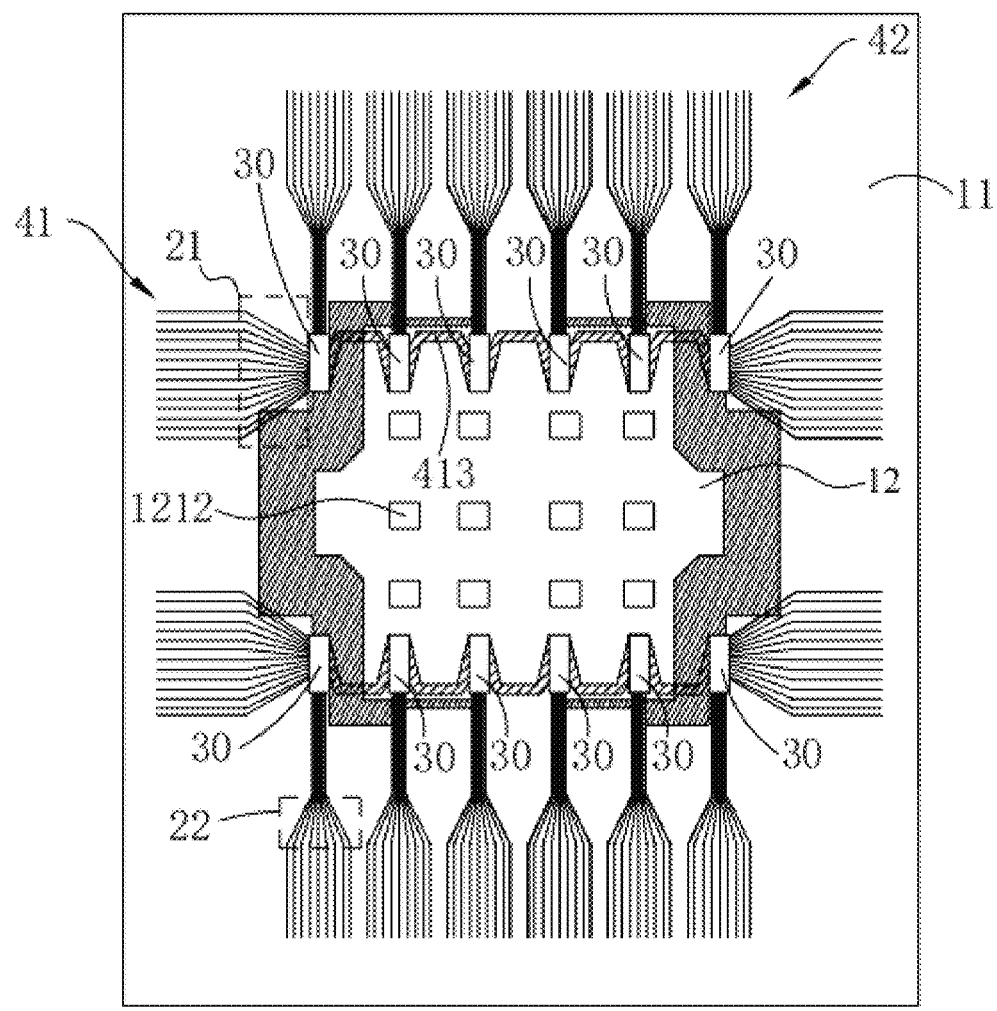
FIG. 6 and FIG. 7 are schematic views showing an arrangement of a driving circuit and a signal line according to an embodiment of the present invention.
Figure 7:
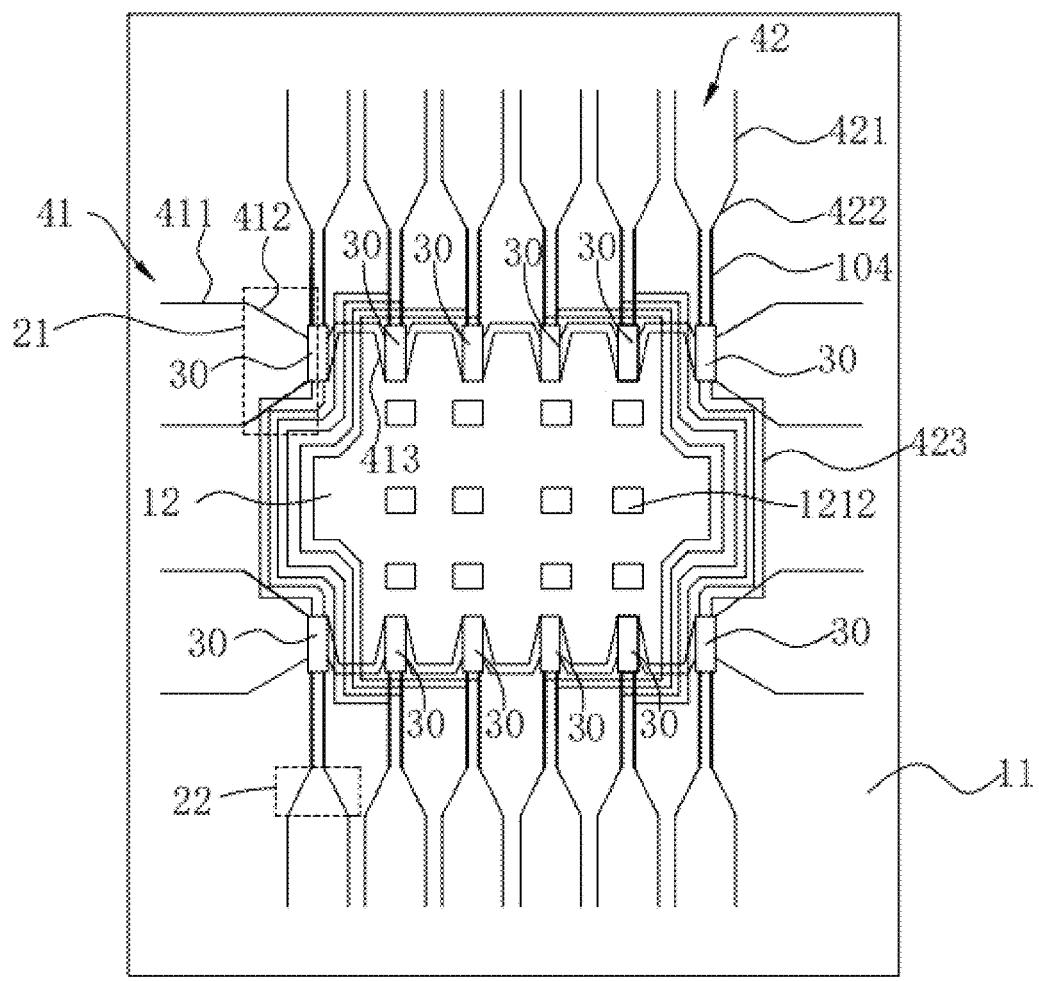

As shown in FIG. 6 and FIG. 7, a first anode 1212 for driving one of the plurality of first pixels 121 is disposed in the functional add-on region 12, a peripheral side of the functional add-on region 12 is provided with a plurality of first driving circuits 1211 and a signal line, and the first driving circuit 1211 is electrically connected to the first anode 1212 through a transparent wire.

A plurality of pixel driving circuit islands 30 are disposed on the peripheral side of the functional add-on region 12, a first group of pixel driving circuit islands 30 among the pixel driving circuit islands 30 comprises a plurality of the first driving circuits 1211, the signal lines comprise a plurality of first signal lines 41 and a plurality of second signal lines 42, and the plurality of first signal lines 41 and the plurality of the second signal lines 42 are electrically connected to the plurality of first driving circuits 1211.

The first driving circuit 1211 and the signal lines for driving the first pixel 121 are disposed on the peripheral side of the functional add-on region 12 to ensure that the pixel driving circuit island 30 is not required to be disposed in the functional add-on region 12, thereby preventing the first driving circuit 1211 and the signal line from affecting the display and light transmission of the functional add-on region 12. Moreover, the first driving circuit 1211 is distributed in an island shape, and the size and transmittance of the functional add-on region 12 can be further increased.

It should be noted that, in addition to driving the first pixels 121 in the functional add-on region 12, the pixel driving circuit island 30 may also be responsible for driving a part of the second pixels 111 in the main display region 11 close to the functional add-on region 12.

It should be noted that each of the pixel driving circuit islands 30 is formed by collectively gathering a plurality of pixel driving circuits in an island shape, and the concentrated gathering is compared with the dispersion of the pixel driving circuits in the conventional technology. That is, it is compared with one pixel driving circuit corresponding to one pixel in the conventional technology. The pixel driving circuit comprises a plurality of switching elements, capacitors, signal lines, etc., and the switching elements may be thin film transistors, diodes or other devices.

Specifically, the first signal line 41 and the second signal line 42 are electrically connected to the pixel driving circuit island 30 to input various electrical signals to the pixel driving circuit island 30. The pixel driving circuit island 30 is electrically connected to the first anode 1212 through a transparent wire to transmit an electrical signal to the first anode 1212.

The first signal line 41 may comprise at least one of a scan line, an illuminating signal line for controlling the illuminating of the OLED, or a reset line for controlling the anode reset of the OLED. Each of the first signal lines 41 comprise a first straight line section 411, a first bypass section 413, and a first transition section 412.

Specifically, the display panel 10 further comprises a plurality of first sector regions 21 and a plurality of second sector regions 22. The first sector region 21 is an area defined by a plurality of first transition sections 412 in a fan-shaped arrangement, and the second sector region 22 is an area defined by a plurality of second transition sections 422 in a fan-shaped arrangement.

Wherein, a plurality of first straight line sections 411 are horizontally arranged in parallel, the first transition section 412 is disposed in the first sector region 21, and the plurality of first transition sections 412 are fan-shaped in the first sector region 21. The first straight line section 411 extends to the first sector region 21 and is electrically connected to the first transition section 412, so that the plurality of first signal lines 41 are integrated with the plurality of sets of first signal lines 41, and thus change an extended path of the plurality of sets of first signal lines 41 to avoid the functional add-on region 12. A spacing between adjacent two first transition sections 412 in the first sector section 21 is less than a spacing between adjacent two first straight line sections 411. In order to prevent a short circuit between the two adjacent first transition sections 412 having less spacing, the plurality of first transition sections 412 of the first sector region 21 may be divided into at least two layers.

The first bypass section 413 of the plurality of the first signal lines 41 is disposed at an edge of the functional add-on region 12, and the first bypass section 413 is electrically connected to all of the pixel drive circuit islands 30 in the first group of the pixel driving circuit island 30 in sequence. The first bypass section 413 can be a straight line, an arc, or a plurality of polygonal sections.

Specifically, the second signal line 42 may comprise data lines. Each of the second signal lines 42 comprises a second straight line section 421, a second bypass section 423, and a second transition section 422.

Wherein, the plurality of second straight line sections 421 of the plurality of second signal lines 42 are vertically arranged in parallel. A vertical projection of the plurality of first straight line sections 411 of the plurality of first signal lines 41 on the display panel 10 and a vertical projection of the plurality of second straight line sections 421 of the plurality of second signal lines 42 on the display panel 10 intersect perpendicular with each other. The second transition section 422 is disposed in the second sector region 22, and the plurality of second transition sections 422 are fan-shaped in the second sector region 22. The second straight line section 421 extends to the second sector region 22 and is electrically connected to the second transition section 422, so that the plurality of second signal lines 42 are integrated with the plurality of sets of second signal lines 42, and thus change an extended path of the plurality of sets of second signal lines 42 to avoid the functional add-on region 12. A spacing between adjacent two second transition sections 422 in the second sector region 22 is less than a spacing between adjacent two second straight line sections 421.

The plurality of second straight line sections 421 of the plurality of second signal lines 42 are divided into a plurality of clusters respectively extending to the plurality of second sector regions 22 to be electrically connected to the plurality of second transition sections 422. Each cluster of the first straight line section 411 correspondingly extends into the second sector region 22. The plurality of second transition sections 422 are divided into a plurality of clusters, and each cluster of second transition sections 422 is disposed in the same second sector region 22. The plurality of second sector regions 22 are symmetrically disposed on opposite sides of the functional add-on region 12 and disposed adjacent to the first bypass line. The second bypass section 423 of the plurality of second signal lines 42 is disposed at the edge of the function addition region 12. The second transition section 422 is electrically connected to the second bypass section 423 one-to-one. The first bypass section 413 and the second bypass section 423 are disposed at different layers.

The first bypass section 413 and the second bypass section 423 are disposed at different layers, and the second bypass section 423 of the plurality of second signal lines 42 is disposed at an edge of the functional add-on region 12. The two ends of the second bypass section 423 are electrically connected to the second transition section 422, that is, the second bypass section 423 is electrically connected to the second transition section 422.

Further, the functional add-on region 12 is convex or concave corresponding to an edge of the first group of pixel driving circuit islands 30 at the edge of the first bypass section 413 to increase a light transmissive area of the functional add-on region 12.

As shown in FIG. 7, the display panel 10 further comprises a plurality of connecting lines 104. The connecting line 104 and the second bypass section 423 are disposed in different layers, and each set of the second bypass section 423 comprises at least two second bypass sections 423 having different lengths. The two ends of the second bypass section 423 of each cluster are respectively electrically connected to the pixel driving circuit islands 30 of the first group of pixel driving circuit islands 30 which are mutually mirrored by the connecting line 104, so as to avoid the same group of two adjacent clusters of second bypass sections 423 have short circuits during the extension process in order to achieve electrical connection with the pixel driving circuit islands 30.

Figure 8:
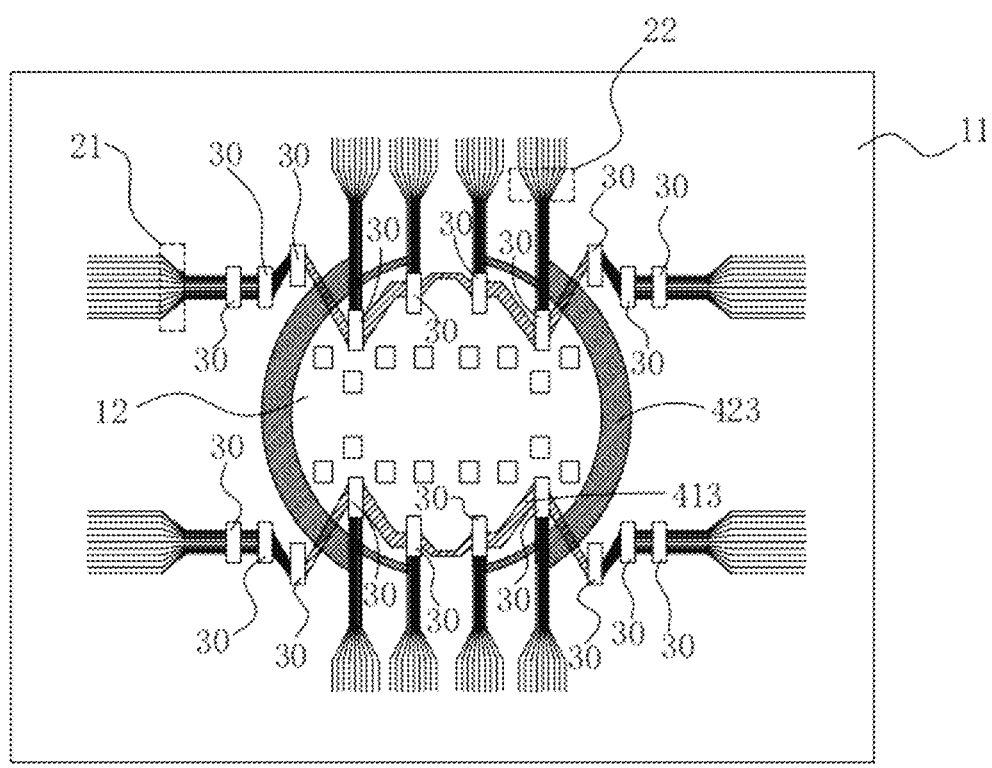
FIG. 8 and FIG. 9 are schematic views showing an arrangement of a driving circuit and a signal line according to another embodiment of the present invention.
Figure 9:
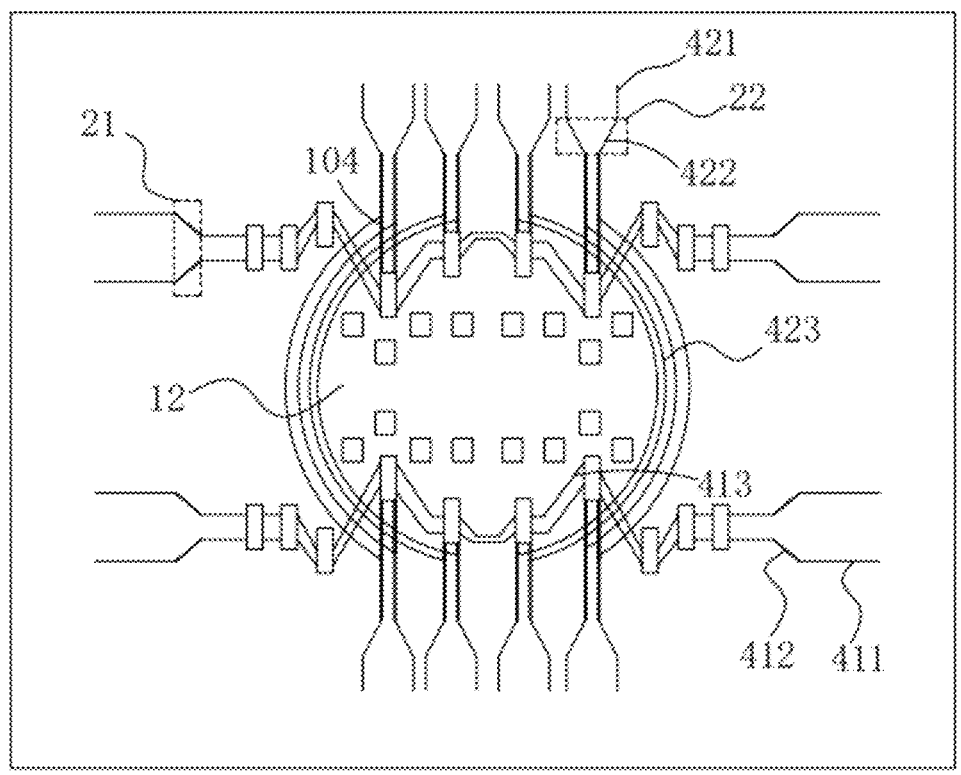

As shown in FIG. 8 and FIG. 9, the display panel 10 shown in FIG. 8 is basically similar in structure to the display panel 10 shown in FIG. 6, except that the second bypass section 423 of the second signal line 42 is arranged in an arc.

Specifically, the second bypass section 423 of the second signal line 42 is disposed in a circular arc line, and the overall shape of the functional add-on region 12 is circular. The second bypass section 423 of the second signal line 42 is disposed in an elliptical arc, and the overall shape of the functional add-on region 12 is elliptical.

Figure 10:
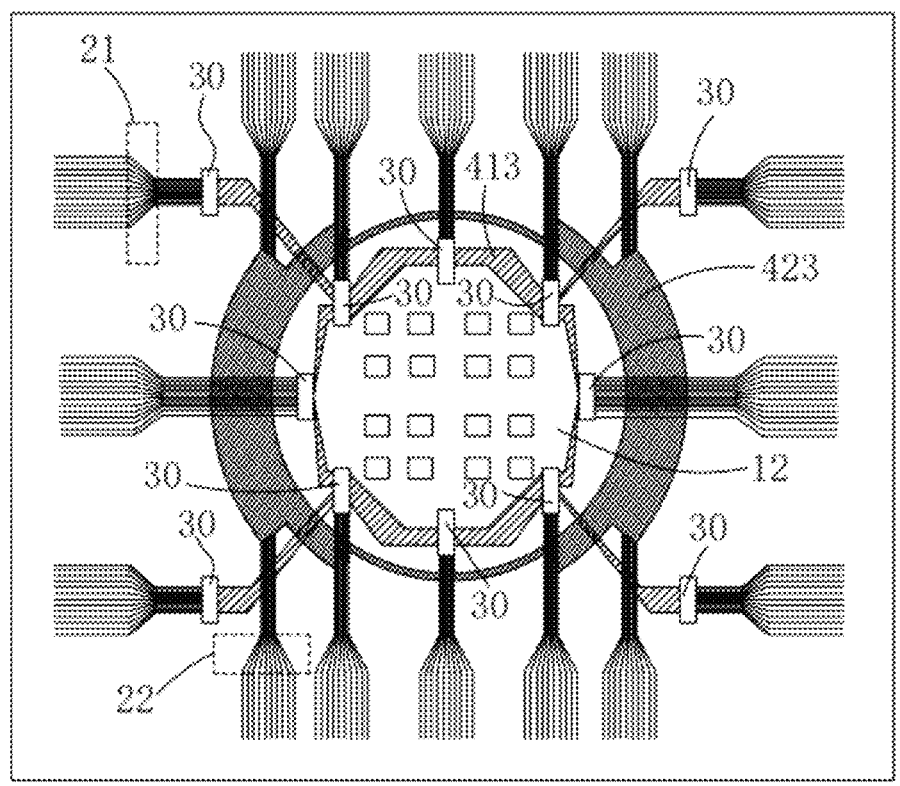
FIG. 10 and FIG. 11 are schematic views showing an arrangement of a driving circuit and a signal line according to yet another embodiment of the present invention.
Figure 11:
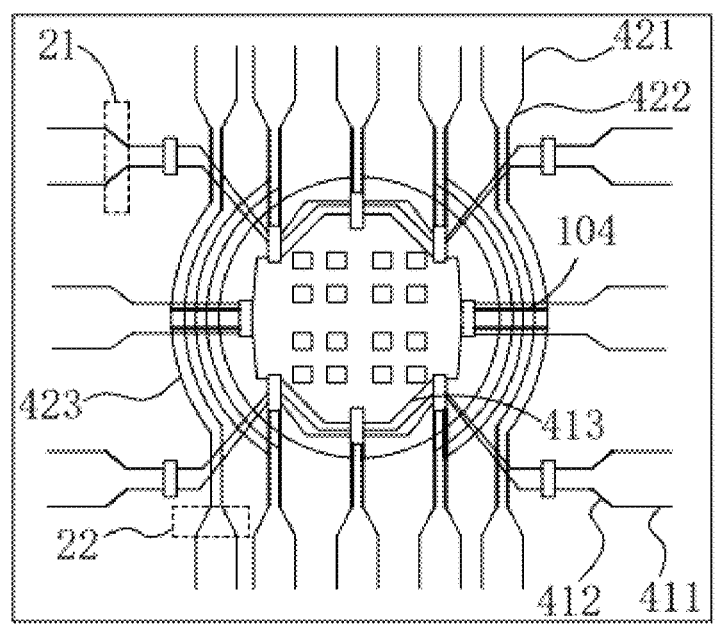

As shown in FIG. 10 and FIG. 11, the display panel 10 shown in FIG. 10 is substantially similar in structure to the display panel 10 shown in FIG. 6, except that at least one portion of the second bypass section 423 of the second signal line 42 is disposed around the entire functional add-on region 12.

A portion of the pixel driving circuit islands 30 are uniformly arranged in a ring shape at the edge of the functional add-on region 12. The second bypass sections 423 of the plurality of second signal lines 42 are disposed around the functional add-on region 12 and are electrically connected to at least one portion of the pixel driving circuit islands 30. The first bypass sections 413 of the plurality of first signal lines 41 are electrically connected to any two adjacent pixel driving circuit islands 30 of the pixel driving circuit islands 30 in sequence.

In the conventional technology, a pixel driving circuit is disposed under each of the display sub-pixels, so that the plurality of pixel driving circuits corresponding to the plurality of display pixels are distributedly distributed. By providing a plurality of pixel drive circuit islands 30 formed by the pixel drive circuits in a relatively concentrated manner on the periphery of the functional add-on region 12, the first driving circuit 1211 in the pixel driving circuit island 30 is used to drive the plurality of first pixels 121 in the functional add-on region 12 so that the functional add-on region 12 does not set the pixel driving circuit, thereby improving the transmittance of the functional add-on region 12. The arrangement of the plurality of pixel driving circuit islands 30 also increases the size of the functional add-on region 12.

Figure 12:
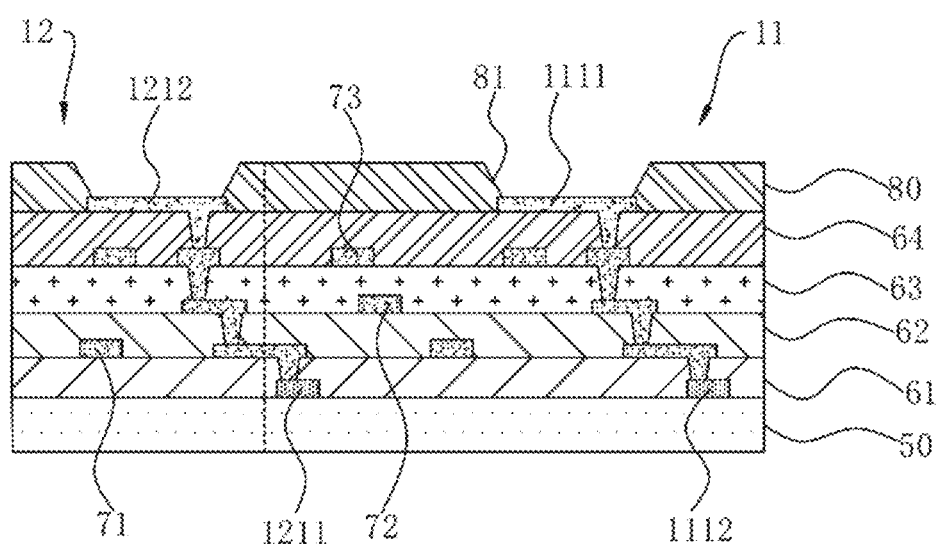
FIG. 12 is a schematic structural view of a display panel according to an embodiment of the present invention.
Figure 13:
FIG. 13 is a schematic structural view of a display device of the present invention.

As shown in FIG. 12, the display panel 10 comprises a substrate 50 and at least two insulating layers disposed on the substrate 50. The first driving circuit 1211 is disposed on the substrate 50 and covered by the insulating layer, and the first driving circuit 1211 and the first anode 1212 are electrically connected through a transparent wire disposed in the insulating layer.

Further, the transparent wire comprises at least two connecting wires at different layers.

Further, the substrate 50 is provided with a second driving circuit 1112 in the main display region 11, and the second pixel 111 is electrically connected to the second driving circuit 1112 through a conductive layer disposed in the insulating layer.

In an embodiment, the display panel 10 comprises a first driving circuit 1211 disposed on the substrate 50, a first insulating layer 61 covering the first driving circuit 1211, a first overlapping line 71 disposed on the first insulating layer 61, a second insulating layer 62 covering the first overlapping line 71, a second overlapping line 72 disposed on the second insulating layer 62, a third insulating layer 63 covering the second overlapping line 72, a third overlapping line 73 disposed on the third insulating layer 63, a fourth insulating layer 64 covering the second overlapping line 72, a pixel anode disposed on the fourth insulating layer 64, and a pixel definition layer 80 having a pixel opening 81 corresponding to the pixel anode.

The overlapping lines disposed in the functional add-on region 12 are transparent wires. The overlapping lines at different layers are electrically connected through vias. The electrical connection between the first anode 1212 and the first driving circuit 1211 is realized by electrical connection of the overlapping lines at different layers, thereby facilitating wiring arrangement.

Specifically, the spacing between adjacent two overlapping lines on the same layer is greater than 2 micrometers to avoid short circuit between adjacent two overlapping lines on the same layer. A line width of each overlapping line is greater than 1 micron.

Wherein, the pixel anode comprises a first anode 1212 and a second anode 1111 for driving the second pixel 111. The second anode 1111 is disposed in the main display region 11, and the conductive layer may have the same structure and process as the transparent wire. The second anode 1111 is electrically connected to the second driving circuit 1112 through a plurality of overlapping lines.

It should be noted that, in actual implementation, the conductive layer may also be formed by multiple layers of opaque conductive lines disposed in the main display region 11. That is, the overlapping lines disposed in the main display region 11 are opaque conductive lines.

It should be noted that FIG. 12 only shows that the first anode 1212 is electrically connected to the first driving circuit 1211 through the overlapping lines disposed in the functional add-on region 12. In an actual implementation, the first anode 1212 can also be electrically connected to the first driving circuit 1211 through the overlapping line in the main display region 11.

It should be noted that FIG. 12 only shows a case of having three layers of the overlapping lines. In actual implementation, it can also be set to two, four, five, or more layers of the overlapping lines.

It should be noted that materials of the transparent wires include, but are not limited to, indium tin metal oxide, indium zinc metal oxide, fluorine tin metal oxide, or nano silver wire. The insulating layer is made of a transparent material including, but not limited to, silicon oxide or silicon nitride.

Based on the above display panel 10, the present invention also provides a display device. The display device comprises the display panel 10 described above and a functional device 103 disposed corresponding to the functional add-on region 12 of the display panel 10.

The function device 103 can be a photosensitive element such as a camera, an optical touch component, and a fingerprint recognition sensor.

The beneficial effects of the invention are: by removing corresponding portions of the touch layer 90 and the additional functional region, the touch layer 90 is prevented from affecting the photographing and imaging of the photosensitive elements such as the camera, and determining whether to arrange the touch lines 101 at the opening 91 according to the area of the opening 91. When the area of the opening 91 is small, the touch line is not provided at the opening 91 of the touch layer 90. When the area of the opening 91 is large, the touch lines 101 are formed by using the highly transparent conductor material. Thus, the opening 91 has the touch function, and the functional add-on region 12 can also be used for displaying images and mounting the photosensitive elements such as the camera to improve the user experience.

In the above, various other corresponding changes and modifications can be made according to the technical solutions and technical ideas of the present invention by those skilled in the art, and all such changes and modifications are within the scope of the claims of the present invention.

What is claimed is:

1. A display panel, comprising:
   a touch layer; and
   a main display region and a functional add-on region;
   wherein a plurality of first pixels are arranged in the functional add-on region, and the touch layer is provided with an opening corresponding to the functional add-on region;
   wherein a transmittance of the touch layer corresponding to the functional add-on region is greater than a transmittance of the touch layer corresponding to the main display region;
   wherein there is no touch line arranged in the opening of the touch layer, or there is a touch line formed by a transparent conductor material disposed in the opening of the touch layer; and
   wherein a peripheral side of the functional add-on region is provided with at least one first driving circuit and at least one signal line, a first anode for driving one of the plurality of first pixels is disposed in the functional add-on region, and the at least one first driving circuit is electrically connected to the first anode through a transparent wire.

2. The display panel as claimed in claim 1, wherein no touch line is arranged in the opening of the touch layer when an area of the opening of the touch layer is less than or equal to 4 square millimeters ($mm^2$).

3. The display panel as claimed in claim 1, wherein no touch line is arranged in the opening of the touch layer when a diameter of the opening of the touch layer is less than or equal to 2 mm.

4. The display panel as claimed in claim 3, wherein a shape of the opening of the touch layer is circular, large semicircular, or small semicircular.

5. The display panel as claimed in claim 1, wherein the touch line is electrically connected to the touch layer.

6. The display panel as claimed in claim 1, wherein a plurality of pixel driving circuit islands are disposed on the peripheral side of the functional add-on region, a first group of pixel driving circuit islands among the pixel driving circuit islands comprises a plurality of first driving circuits, the at least one signal line comprises a plurality of first signal lines and a plurality of second signal lines, and the plurality of first signal lines and the plurality of second signal lines are electrically connected to the plurality of first driving circuits.

7. The display panel as claimed in claim 6, wherein each of the first signal lines comprises a first bypass section, each of the second signal lines comprises a second bypass section, and the first bypass section and the second bypass section are disposed at different layers; and
   wherein the first bypass sections of the plurality of first signal lines are disposed at an edge of the functional add-on region, and the second bypass sections of the plurality of second signal lines are disposed at the edge of the functional add-on region.

8. A display panel, comprising:
   a touch layer; and
   a main display region and a functional add-on region;
   wherein a plurality of first pixels are arranged in the functional add-on region, and the touch layer is provided with an opening corresponding to the functional add-on region;
   wherein a transmittance of the touch layer corresponding to the functional add-on region is greater than a transmittance of the touch layer corresponding to the main display region; and
   wherein a peripheral side of the functional add-on region is provided with at least one first driving circuit and at least one signal line, a first anode for driving one of the plurality of first pixels is disposed in the functional add-on region, and the at least one first driving circuit is electrically connected to the first anode through a transparent wire.

9. The display panel as claimed in claim 8, wherein no touch line is arranged in the opening of the touch layer.

10. The display panel as claimed in claim 9, wherein no touch line is arranged in the opening of the touch layer when an area of the opening of the touch layer is less than or equal to 4 square millimeters ($mm^2$).

11. The display panel as claimed in claim 9, wherein no touch line is arranged in the opening of the touch layer when a diameter of the opening of the touch layer is less than or equal to 2 mm.

12. The display panel as claimed in claim 11, wherein a shape of the opening of the touch layer is circular, large semicircular, or small semicircular.

13. The display panel as claimed in claim 8, wherein a touch line formed by a transparent conductor material is disposed in the opening of the touch layer.

14. The display panel as claimed in claim 13, wherein the touch line is electrically connected to the touch layer.

15. The display panel as claimed in claim 8, wherein a plurality of pixel driving circuit islands are disposed on the peripheral side of the functional add-on region, a first group of pixel driving circuit islands among the pixel driving circuit islands comprises a plurality of first driving circuits, the at least one signal line comprises a plurality of first signal lines and a plurality of second signal lines, and the plurality of first signal lines and the plurality of second signal lines are electrically connected to the plurality of first driving circuits.

16. The display panel as claimed in claim 15, wherein each of the first signal lines comprises a first bypass section, each of the second signal lines comprises a second bypass section, and the first bypass section and the second bypass section are disposed at different layers; and
   wherein the first bypass sections of the plurality of first signal lines are disposed at an edge of the functional add-on region, and the second bypass sections of the plurality of second signal lines are disposed at the edge of the functional add-on region.

17. A display device, comprising the display panel as claimed in claim 8 and a functional device disposed corresponding to the functional add-on region of the display panel.

* * * * *

UNITED STATES PATENT AND TRADEMARK OFFICE
CERTIFICATE OF CORRECTION

| | |
|---|---|
| PATENT NO. | : 11,221,693 B2 |
| APPLICATION NO. | : 16/753779 |
| DATED | : January 11, 2022 |
| INVENTOR(S) | : Yong Zhao |

It is certified that error appears in the above-identified patent and that said Letters Patent is hereby corrected as shown below:

On the Title Page

Item (73) Assignee:
"Wuhan China Star Optoelectronics Semicorduetor Display Technology Co., Ltd."
Should be changed to:
--Wuhan China Star Optoelectronics Semiconductor Display Technology Co., Ltd.--

Signed and Sealed this
Twenty-third Day of August, 2022

Katherine Kelly Vidal
*Director of the United States Patent and Trademark Office*